United States Patent [19]

Murrell

[11] 4,219,610

[45] Aug. 26, 1980

[54] TREATMENT OF MAGNETIC GARNET FILM

[75] Inventor: Donald L. Murrell, Ipswich, England

[73] Assignee: Post Office, London, England

[21] Appl. No.: 911,057

[22] Filed: May 23, 1978

[30] Foreign Application Priority Data

May 25, 1977 [GB] United Kingdom ............... 22048/77

[51] Int. Cl.² ............................................. B05D 5/12
[52] U.S. Cl. .................................... 428/469; 156/605;
156/606; 204/192 M; 365/33; 427/131;
427/132; 428/539; 428/900
[58] Field of Search ..................... 365/27, 33; 427/131,
427/132; 156/605, 606; 428/539, 195, 900, 209,
469, 471, 472; 204/197 M

[56] References Cited

U.S. PATENT DOCUMENTS

| | | | |
|---|---|---|---|
| 3,995,093 | 11/1976 | Heinz | 428/900 |
| 4,098,917 | 7/1978 | Bullock et al. | 427/131 |
| 4,104,422 | 8/1978 | Sandfort | 427/131 |
| 4,124,736 | 11/1978 | Palet et al. | 427/132 |

FOREIGN PATENT DOCUMENTS 1444536 7/1973 Fed. Rep. of Germany .......... 156/605
2415717 10/1975 Fed. Rep. of Germany .

OTHER PUBLICATIONS

Le Craw et al. IEEE Transactions on Magnetics vol. Mag. 9 No. 3 Sep. 1973, Localized Control of Magnetization In LPE Buffle Garnet Films.
Klokholm et al., IBM Technical Disclosure Bulletin, vol. 19, No. 10 (Mar. 1977) 4015-4016.

Primary Examiner—Stanley S. Silverman
Attorney, Agent, or Firm—Mason, Fenwick & Lawrence

[57] ABSTRACT

The magnetic bias field required to collapse magnetic domains in an epitaxial liquid phase grown garnet is reduced by a method of depositing a layer of a suitable element, e.g. gallium or chromium, on the surface of the garnet after growth and then heating the garnet. The suitability of the element depends on its atomic diameter and affinity for oxygen.

Propagation paths for bubbles in a magnetic bubble memory are defined by treating a garnet except where the propagation paths are required, by the method.

12 Claims, 1 Drawing Figure

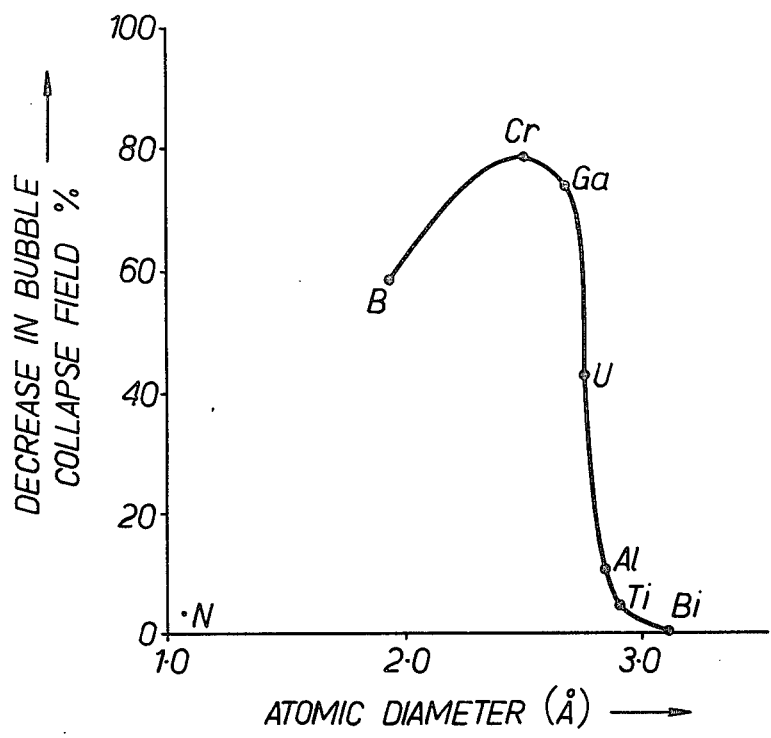

TREATMENT OF MAGNETIC GARNET FILM

This invention relates to the treatment of magnetic garnet film of the type which when placed across a magnetic field of the appropriate strength results in the formation of cylindrical magentic domains extending through the thickness of the film. Such domains are sometimes referred to as magnetic bubbles.

It has been proposed to use magnetic bubbles for the storage of binary coded information and to move the magnetic bubbles under the influence of magnetic fields along paths defined by high permeability magnetic structures adjacent to the garnet film in which the bubbles exist. It has been found that it is possible to reduce the saturation magnetisation of the garnet film by certain treatment. Such treatment is described by Le Craw et al in "Localised Control of Magnetization in LPE Bubble Garnet Films" IEEE trans. on Magnetics Vol. MAG 9 No.3—September 1973. The apparatus used by Le Craw is however very complex. If this is done selectively it is possible to leave a region within the garnet film in which the magnetic bubbles can exist, while the rest of the garnet film, having a lower saturation magnetisation, cannot support bubbles at the same magnetic bias field strength. In this way a propagation channel for magnetic bubbles can be defined.

It is an object of the present invention to provide a method of treating a garnet film to reduce its saturation magnetisation and hence the bias field required to collapse the magnetic domains.

According to the present invention there is provided a method of treating a liquid phase grown epitaxial film of a garnet containing gallium to reduce the bias field required to collapse its magnetic domain, the method including depositing on to the garnet film after its formation a thin film of an element other than silicon, which element has an atomic diameter greater than that of boron and less than that of aluminium and has an affinity for oxygen greater than that of iron, and then diffusing some of said element into the film by heating it to a temperature between 500° C. and 800° C.

Silicon had the disadvantage that it is particularly prone to oxidation contamination during deposition from vapour, so that a very high vacuum is necessary. Aluminium is unsuitable because its atomic diameter is too great, preventing it from diffusing a sufficient distance into the garnet lattice. The atomic diameter of boron is too small, making it unsuitable as diffusion is too rapid.

The element may be, for example, chromium or gallium and the following description relates specifically to one or other of these elements although the processes described may be used with other elements having the properties described above possibly with slight variations and with slightly different results. Such other elements include uranium.

The deposition of the chromium or gallium on the garnet film may be carried out in a vacuum by evaporation or sputtering electrically.

The subsequent heat treatment of the garnet once the film has been deposited on it may, for example, be of duration 0.25 to 30 hours at a temperature of 500° C., or from 2 to 40 minutes at 600° C. Intermediate durations and temperatures can also be employed, the duration decreasing with increase of temperature. The heat treatment may in the case of gallium and chromium be carried out in air, but it has been found that an inert atmosphere such as nitrogen is required for elements such as selenium and manganese which, it is thought, completely oxidise in air whereas gallium and chromium form protective oxide coatings.

The film of chromium or gallium may be selectively applied to the surface by first forming a photoresist pattern on the surface of the garnet film, depositing chromium or gallium over the surface and the photoresist pattern, and then removing the photoresist when its chromium or gallium covering will also be removed from the garnet film because it has no attachment to it. A garnet film treated in this way can be arranged to have one or more channels of high saturation magnetisation with the remainder of the film being of low saturation magnetisation. A magnetic field applied through the film can be arranged to permit the existence of cylindrical magnetic domains (magnetic bubbles) only in the channel or channels of high saturation magnetisation, the strength of the magnetic field exceeding that needed to cause collapse of the magnetic bubbles in the remainder of the garnet film.

It is known that if the bias field used to maintain magnetic bubbles in a garnet film is increased steadily the bubbles shrink and finally collapse. There is a relationship between the saturation magnetisation $4\pi M_s$ of the garnet film and the field strength H necessary to produce collapse of the magnetic bubbles, which is given by the following expression:

$$H = 4\pi M_s (1 - 0.866 \, 1/h)^2$$

where '1' is the characteristic length of the garnet and 'h' is the thickness of the garnet film. Thus providing that the characteristic length '1' does not decrease markedly when the saturation magnetisation is reduced, then reducing the saturation magnetisation $4\pi M_s$ results in a reduction of the valve of H.

Although the full mechanism by which the saturation magnetisation and collapse field is reduced is not fully understood it is believed that the element diffuses into interstitial sites within the garnet lattice. This would explain the importance of atomic diameter. Once in the lattice it is believed that the presence of the element interferes with the superexchange interaction between $Fe^{3+}$ ions and $O^{2-}$ ions by virtue of its affinity of oxygen.

There will now be described a process for the treatment of a magnetic garnet film of nominal composition

$$Y_{2.35}Eu_{0.65}Fe_{4.38}Ga_{0.62}O_{12}$$

to produce selectively areas of low magnetisation within the film. Reference will be made to the drawing which is a graph showing the efficacy of various elements when used in the process of the invention plotted against their atomic diameters.

A film of gallium is selectively applied to the surface of a magnetic garnet film by first forming a pattern of photoresist on the film by a standard photolithographic technique. The complete surface of the garnet is then coated with a layer of gallium about 0.1 microns thick by evaporation and deposition in a vacuum of $1.33 \times 10^{-4}$ $Nm^{-2}$. The gallium may be vaporised in an alumina crucible containing a heated tungsten element, or by any other suitable method.

Once the layer of gallium has been deposited the photoresist, typically Shipley AZ135OH, is dissolved and removed by washing the garnet in acetone. Removal of the resist takes with it its gallium coating leaving the metal only where it was deposited directly onto the garnet film.

The coated garnet is then heated in air in an oven at a temperature of 800° C. for 5 minutes. As a result of this process it will be observed that the saturation magnetisation and the bias field required for bubble collapse have become signaificantly lower in the areas of the garnet covered by gallium, whereas in the areas from which the gallium had been removed no such lowering has occurred.

The regions of low magnetisation thus formed may be arranged so that the remaining area forms a path suitable for bubble propagation in a magnetic bubble memory.

The process just described has been performed using other elements than gallium, and the drawing shows for the different elements the effect of the treatment on the bubble domain collapse field plotted against the atomic diameter of the element.

Although most of the experiments were conducted on a magnetic garnet of the composition mentioned above, other magnetic garnets have been found to respond similarly.

Advantages accrued from the provision of channels in a film of garnet in which magnetic bubbles can exist when the remainder of the garnet film will not maintain such bubbles are as follows:

(1) Magnetic bubbles cannot stray from the propagation channel and find their way to corrupt data in another part of the propagation path for the bubbles.

(2) There are no stray bubbles in the remainder of the garnet film which can enter the propagation path.

(3) A high density of magnetic bubbles can be used along the propagation channel.

(4) A number of magnetic bubble propagation paths can be arranged adjacent to one another provided they are separated by a region of low saturation magnetisation without risk to bubbles straying from one propagation path to another.

I claim:

1. A method for treating a liquid phase grown epitaxial film of a garnet containing gallium to reduce the bias field required to collapse its magnetic domains, the method including depositing on to the garnet film after its formation a thin film of an element other than silicon, which element has an atomic diameter greater than that of boron and less than that of aluminium and has an affinity for oxygen greater than that of iron, and then diffusing some of the said element into the film by heating it to a temperature between 500° C. and 800° C.

2. A method according to claim 1 wherein the element is deposited in a vacuum following evaporation.

3. A method according to claim 1 wherein the element is deposited in a vacuum following sputtering.

4. A method according to claim 1 wherein the heating is conducted in air and the element is one which forms a protective oxide coating when heated in air.

5. A method according to claim 1 wherein the heating is conducted in an inert atmosphere, for example nitrogen.

6. A method according to claim 1 wherein the element is chromium.

7. A method according to claim 1 wherein the element is gallium.

8. A method according to claim 1 wherein the film is heated at a temperature at 500° C. for between 0.25 and 30 hours.

9. A method according to claim 1 wherein the film is heated to a temperature of 600° C. for between 2 and 40 minutes.

10. A method according to any of claims 1 or 9 wherein the element is selectively applied to the surface of the garnet film by first forming a pattern of resist on the surface of the garnet film, then depositing a layer of the element on the surface of the resist and garnet film, and then removing the resist; so that the element adheres to the garnet film only where there was no resist in the pattern.

11. A magnetic bubble memory device including an epitaxial garnet film having at least one first region and at least one second region, each first region having been treated by a method according to any one of claims 1 or 9, so that for a particular range of magnetic bias field strengths magnetic bubbles can only exist in the second region or regions.

12. A magnetic bubble memory device including an epitaxial garnet film which has been treated by a method according to claim 10.

* * * * *